(12) United States Patent
Chen et al.

(10) Patent No.: US 12,342,522 B2
(45) Date of Patent: Jun. 24, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yang Chen, Hefei (CN); Xinru Han, Hefei (CN); Shiran Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 432 days.

(21) Appl. No.: 18/150,885

(22) Filed: Jan. 6, 2023

(65) Prior Publication Data

US 2023/0389264 A1    Nov. 30, 2023

(30) Foreign Application Priority Data

May 26, 2022 (CN) .......................... 202210588996.7

(51) Int. Cl.
H10B 12/00        (2023.01)
(52) U.S. Cl.
CPC ........... *H10B 12/02* (2023.02); *H10B 12/482* (2023.02); *H10B 12/485* (2023.02)
(58) Field of Classification Search
CPC .... H10B 12/02; H10B 12/482; H10B 12/485; H10B 12/315
See application file for complete search history.

(56) References Cited

U.S. PATENT DOCUMENTS

| | | | | |
|---|---|---|---|---|
| 6,087,263 A | * | 7/2000 | Clampitt | H10D 1/716 257/E21.573 |
| 7,557,013 B2 | * | 7/2009 | Bhat | H10D 1/042 257/532 |
| 2006/0113587 A1 | * | 6/2006 | Thies | G11C 7/18 257/E21.655 |
| 2008/0070165 A1 | * | 3/2008 | Fischer | H01L 21/0338 257/E21.236 |
| 2019/0198571 A1 | * | 6/2019 | Xu | H10N 70/841 |
| 2021/0143012 A1 | * | 5/2021 | Huh | H01L 21/0338 |
| 2022/0302127 A1 | * | 9/2022 | Li | H01L 21/76814 |

* cited by examiner

*Primary Examiner* — Yasser A Abdelaziz
(74) *Attorney, Agent, or Firm* — Kilpatrick Townsend & Stockton LLP

(57) ABSTRACT

Embodiments of the present disclosure provide a semiconductor structure and a manufacturing method thereof. The manufacturing method includes: providing a substrate, and forming a sacrificial dielectric layer on the substrate; patterning a part of the sacrificial dielectric layer along a first direction, and forming a plurality of first trenches arranged at intervals along a second direction in the sacrificial dielectric layer; patterning a part of the sacrificial dielectric layer at bottoms of the first trenches and a part of the substrate below the part of the sacrificial dielectric layer, and forming a plurality of second trenches arranged at intervals below the first trenches, wherein the second trench has a preset depth in the substrate; forming a protective layer on sidewalls of the first trenches and sidewalls of the second trenches; and forming bit line structures in the first trenches and the second trenches.

17 Claims, 12 Drawing Sheets

SEMICONDUCTOR STRUCTURE AND MANUFACTURING METHOD THEREOF

CROSS-REFERENCE TO RELATED APPLICATION

This application claims the priority of Chinese Patent Application No. 202210588996.7, submitted to the Chinese Intellectual Property Office on May 26, 2022, the disclosure of which is incorporated herein in its entirety by reference.

TECHNICAL FIELD

The present disclosure relates to the technical field of semiconductor manufacturing, and in particular to a semiconductor structure and a manufacturing method thereof.

BACKGROUND

As the density of semiconductor devices increases, the required pattern pitch and width are gradually reduced, and the critical dimension of the dynamic random access memory (DRAM) is gradually reduced. In the related art, in the process of manufacturing the bit line structure of the DRAM, due to the high aspect ratio of the bit line structure, the bit line structure formed through etching is likely to bend and deform.

The information disclosed in the background art is merely intended to facilitate the comprehension to the background art of the present disclosure, and thus may include information that does not constitute the related art known to those of ordinary skill in the art.

SUMMARY

According to an aspect of the present disclosure, embodiments of the present disclosure provide a method of manufacturing a semiconductor structure, including: providing a substrate, and forming a sacrificial dielectric layer on the substrate; patterning a part of the sacrificial dielectric layer along a first direction, and forming a plurality of first trenches arranged at intervals along a second direction in the sacrificial dielectric layer; patterning a part of the sacrificial dielectric layer at bottoms of the first trenches and a part of the substrate below the part of the sacrificial dielectric layer, and forming a plurality of second trenches arranged at intervals below the first trenches, wherein the second trench has a preset depth in the substrate; forming a protective layer on sidewalls of the first trenches and sidewalls of the second trenches; and forming bit line structures in the first trenches and the second trenches.

According to another aspect of the present disclosure, a semiconductor structure is provided and manufactured by the method described in any of the above embodiments.

BRIEF DESCRIPTION OF THE DRAWINGS

The above and other features and advantages of the present disclosure will become more apparent by describing exemplary embodiments in detail with reference to the accompanying drawings.

Figure 1:
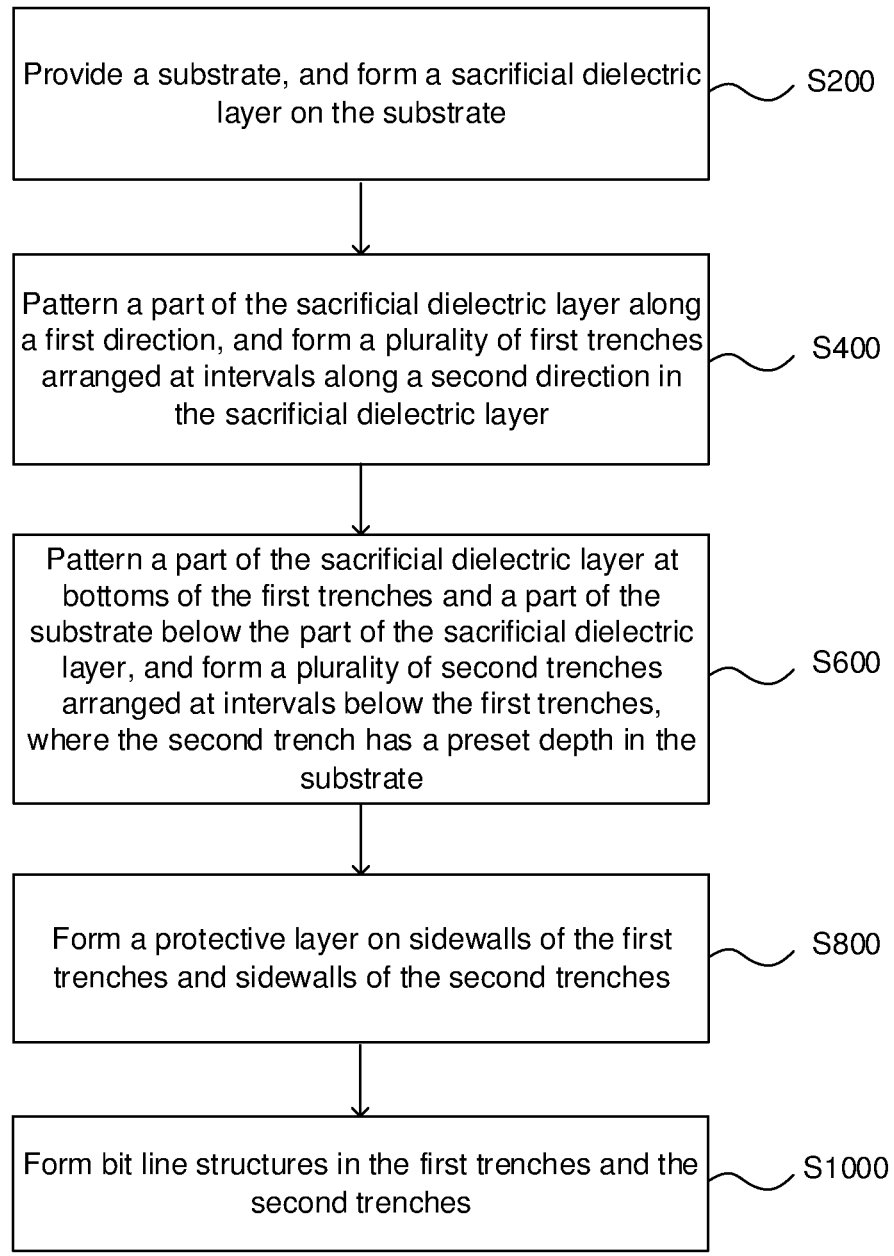
FIG. 1 is a flowchart of a method of manufacturing a semiconductor structure according to an embodiment of the present disclosure.

REFERENCE NUMERALS 1, substrate; 2, sacrificial dielectric layer; 21, first sacrificial dielectric layer; 22, second sacrificial dielectric layer; 23, hard mask layer; 24, etching stop layer; photolithography anti-reflection layer; 251, first photolithography anti-reflection layer; 252, photolithography anti-reflection layer; 26, photoresist layer; 27, sidewall sacrificial layer; 3, protective layer; 31, first protective layer; 32, second protective layer; 33, third protective layer; 4, bit line structure; 41, bit line contact material layer; 42, bit line contact layer; 43, conductive material layer; 44, bit line conductive layer; 45, insulating material layer; 46, bit line insulating layer; 5, mask layer; 51, first mask layer; 52, second mask layer; 6, capacitive contact structure; 61, capacitive contact layer; 62, metal connection layer; L1, first direction; L2, second direction; G1, first trench; G2, second trench; G3, third trench; d1, preset depth: d2, first depth; and h, pattern hole.

DETAILED DESCRIPTION

Exemplary embodiments will be described below comprehensively with reference to the accompanying drawings. However, the exemplary embodiments may be implemented in various forms, and may not be construed as being limited to those described herein. On the contrary, these embodiments are provided to make the present disclosure comprehensive and complete and to fully convey the concept of the exemplary embodiments to those skilled in the art. The same reference numerals in the figures indicate the same or similar structures, and thus their detailed descriptions are omitted.

Different exemplary embodiments of the present disclosure are described below with reference to the accompanying drawings. The accompanying drawings form a part of the present disclosure, which show by way of example different exemplary structures that can implement various aspects of the present disclosure. It should be understood that other specific solutions of is components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure. In addition, the terms "first" and "second" in the claims are used only as markers, not as a limit to the numbers of objects.

The flowcharts shown in the accompanying drawings are only exemplary illustrations, and it is not mandatory to include all content and operations/steps, or perform the operations/steps in the order described. For example, some operations/steps can also be decomposed, while some operations/steps can be merged or partially merged. Therefore, a particular execution order may change based on a particular situation.

In addition, in the description of the present disclosure, "a plurality of" means at least two, such as two or three, unless otherwise expressly and specifically defined. Technical terms for indicating orientations such as "on" and "under" are merely for a clearer description, rather than a limit.

According to an aspect of the present disclosure, a method of manufacturing a semiconductor structure is provided. This is shown in FIGS. 1 to 27. FIG. 1 is a flowchart of a method of manufacturing a semiconductor structure according to an embodiment of the present disclosure. FIGS. 2 to 26 are schematic diagrams of the semiconductor structure in the manufacturing method. As shown in FIG. 1, the method of manufacturing a semiconductor structure in the embodiments includes:

Step S200: Provide a substrate 1, and form a sacrificial dielectric layer 2 on the substrate 1.

Step S400: Pattern a part of the sacrificial dielectric layer 2 along a first direction L1, and form a plurality of first trenches G1 arranged at intervals along a second direction L2 in the sacrificial dielectric layer 2.

Step S600: Pattern a part of the sacrificial dielectric layer 2 at bottoms of the first trenches G1 and a part of the substrate 1 below the part of the sacrificial dielectric layer 2, and form a plurality of second trenches G2 arranged at intervals below the first trenches G1, wherein the second trench G2 has a preset depth d1 in the substrate 1.

Step S800: Form a protective layer 3 on sidewalls of the first trenches G1 and sidewalls of the second trenches G2.

Step S1000: Form bit line structures 4 in the first trenches G1 and the second trenches G2.

In the embodiment of the present disclosure, the first trenches G1 and the second trenches G2 are first formed in the sacrificial dielectric layer 2 and the semiconductor substrate 1, and then the first trenches G1 and the second trenches G2 are filled to form the bit line structures 4. Therefore, the bit line structure 4 of the embodiments of the present disclosure is not formed directly through etching, but is formed by filling the trenches, such that the bit line structure 4 can have a smaller critical dimension, and the sidewall oxidation of the bit line structure 4 can be avoided, thereby avoiding distortion and collapse of the bit line structure 4. In addition, after the bit line structures 4 are formed, the sacrificial dielectric layer 2 does not need to be removed, and can be used in the subsequent process of forming the capacitive contact structures 6, thereby saving costs.

The method of manufacturing a semiconductor structure in the embodiments of the present disclosure is described in detail below.

Step S200: Provide a substrate 1, and form a sacrificial dielectric layer 2 on the substrate 1.

Figure 2:
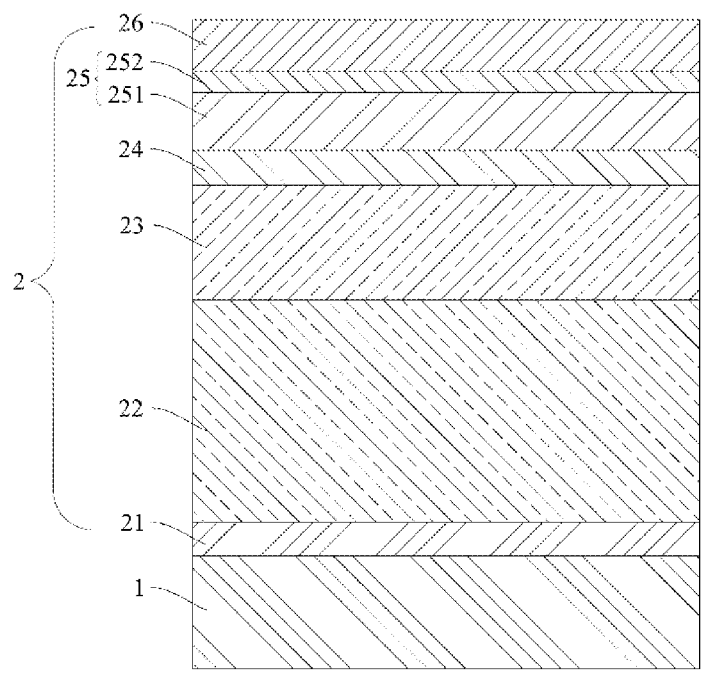
FIG. 2 is a cross-sectional view of a semiconductor structure including a substrate and a sacrificial dielectric layer along a second direction according to an embodiment of the present disclosure.

As shown in FIG. 2, the substrate 1 in the embodiment of the present disclosure may be made of silicon, silicon carbide, silicon nitride, silicon-on-insulator, stacked silicon-on-insulator, stacked silicon-germanium-on-insulator, silicon-germanium-on-insulator, germanium-on-insulator, or the like. Some doping particles may also be injected into the substrate 1 to change its electrical parameters according to design requirements. Those skilled in the art can select the implantation process and doping particles according to actual conditions. This is not described in detail herein.

In some embodiments, the forming a sacrificial dielectric layer 2 on the substrate 1 through a deposition process includes: forming a first sacrificial dielectric layer 21 on the substrate 1; and forming a second sacrificial dielectric layer 22 on the first sacrificial dielectric layer 21. The first sacrificial dielectric layer 21 and the second sacrificial dielectric layer 22 may be formed through atomic layer vapor deposition, chemical vapor deposition or physical vapor deposition. In some embodiments, the material of the first sacrificial dielectric layer 21 may be silicon nitride (for example, $Si_3N_4$), and the material of the second sacrificial dielectric layer 22 may be spin-on silicon oxide (for example, $SiO_2$). In the direction perpendicular to the substrate 1, the first sacrificial dielectric layer 21 is thinner than the second sacrificial dielectric layer 22. The direction perpendicular to the substrate 1 may be understood as a stacking direction for the first sacrificial dielectric layer 21 and the second sacrificial dielectric layer 22, or may further be referred to as a vertical direction.

In some embodiments, as shown in FIG. 2, the first sacrificial dielectric layer 21 and the second sacrificial dielectric layer 22 are formed on the substrate 1, and a hard mask layer 23, an etching stop layer 24, a photolithographic anti-reflection layer 25, and a photoresist layer 26 may also be formed sequentially on the second sacrificial dielectric layer 22. The photolithographic anti-reflection layer 25 may include a first photolithographic anti-reflection layer 251 located on the etching stop layer 24 and a second photolithographic anti-reflection layer 252 located on the first photolithographic anti-reflection layer 251. Certainly, the photolithographic anti-reflection layer 25 may further include only one layer. This is no limited particularly herein. The material of the etching stop layer 24 may be silicon nitride (for example, SiON) or silicon oxynitride (for example, $Si_3N_4$).

Step S400: Pattern a part of the sacrificial dielectric layer 2 along a first direction L1, and form a plurality of first trenches G1 arranged at intervals along a second direction L2 in the sacrificial dielectric layer 2.

Figure 3:
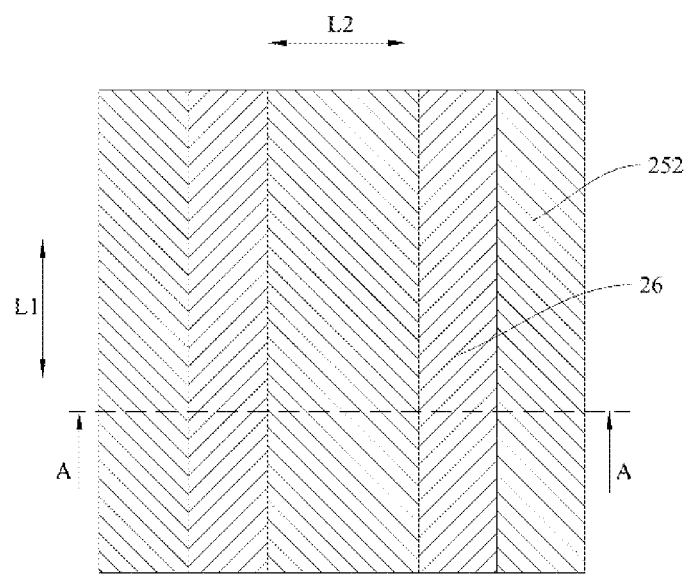
FIG. 3 is a top view of a semiconductor structure including bit line patterns formed on photoresist according to an embodiment of the present disclosure.
Figure 4:
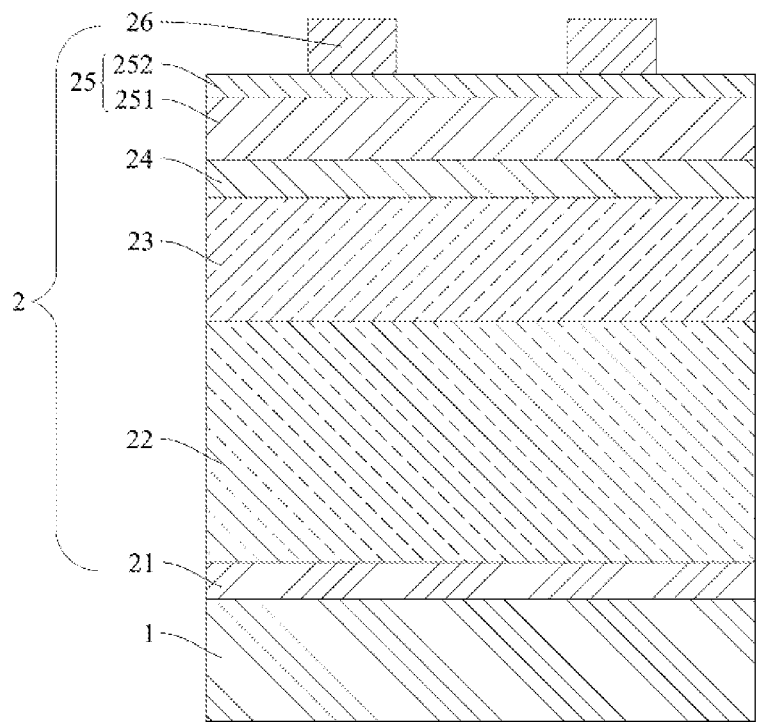
FIG. 4 is a cross-sectional view (a cross-sectional view of the semiconductor structure in the second direction) in FIG. 3 taken along A-A.
Figure 5:
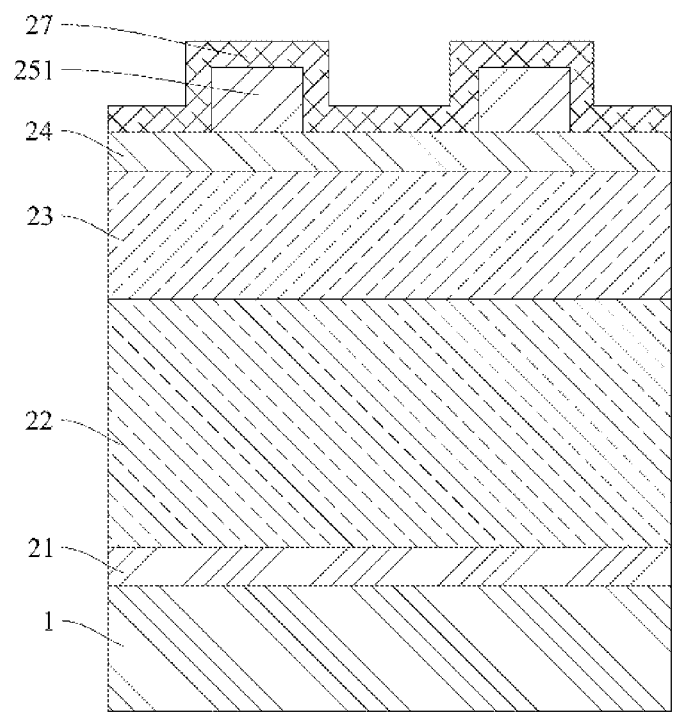
FIG. 5 is a cross-sectional view of a semiconductor structure with a sidewall sacrificial material layer formed on the photoresist along the second direction according to an embodiment of the present disclosure.

In some embodiments, as shown in FIG. 3 and FIG. 4, photolithography and development are performed on the photoresist layer along the first direction L1 to form the photoresist layer 26 having bit line patterns. In the direction perpendicular to the substrate 1, the part covered by the bit line pattern is configured to form the bit line structure 4 in a subsequent process. As shown in FIG. 5, the photoresist layer 26 with the bit line patterns is used as a mask. The bit line patterns are transferred to the photolithographic anti-reflection layer 25, and a part of the etching stop layer 24 not covered by the bit line patterns is exposed. With reference to FIG. 5, the sidewall sacrificial layer 27 is formed on the surface of the part of the etching stop layer 24 that is exposed and the surface of the patterned photolithographic anti-reflection layer 25. The sidewall sacrificial layer 27 can be formed by using a deposition process, and its material can be silicon oxide ($SiO_2$) or silicon oxynitride (SiON).

Figure 6:
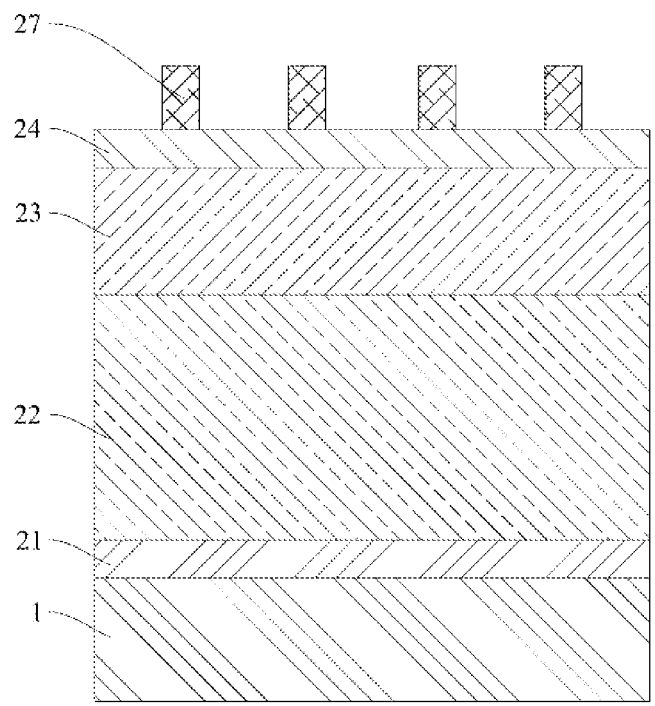
FIG. 6 is a cross-sectional view of the semiconductor structure with a patterned sidewall sacrificial layer along the second direction according to an embodiment of the present disclosure.

As shown in FIG. 6, a part of the sidewall sacrificial layer 27 located on the photolithographic anti-reflection layer 25 and a part of the sidewall sacrificial layer 27 located on the surface of the part of the etching stop layer 24 that is exposed are removed through a dry etching process, and a part of the sidewall sacrificial layer 27 located on the sidewall of the photolithographic anti-reflection layer 25 is retained. The photolithographic anti-reflection layer 25 is removed through dry ashing to form parts of the sidewall sacrificial layer 27 distributed at intervals as shown in FIG. 6.

Figure 7:
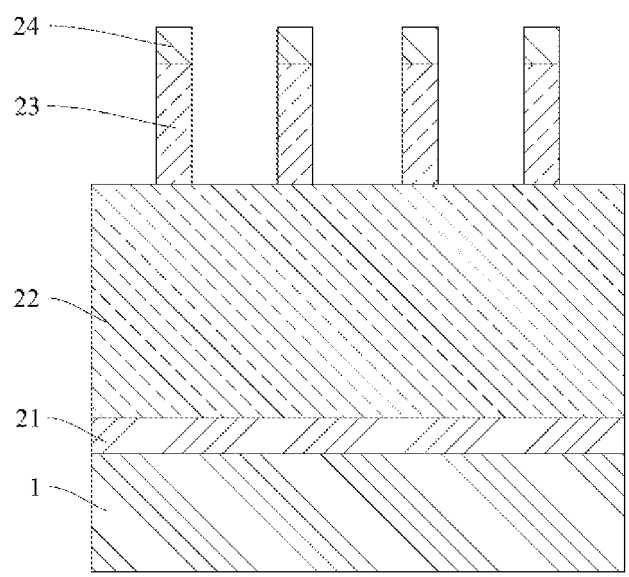
FIG. 7 is a cross-sectional view of the semiconductor structure with a patterned sidewall sacrificial layer along the second direction according to an embodiment of the present disclosure.

As shown in FIG. 7, the spaced parts of the sidewall sacrificial layer 27 are used as a mask to transfer the pattern to the etching stop layer 24 and the hard mask layer 23 located thereunder.

Figure 8:
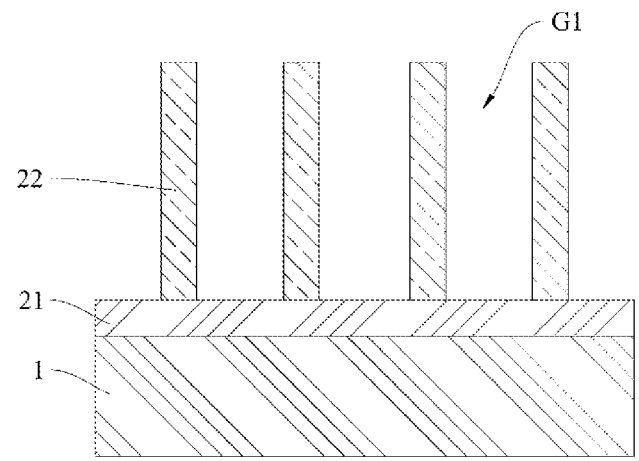
FIG. 8 is a cross-sectional view of a semiconductor structure with first trenches formed after a second sacrificial dielectric layer is patterned in the second direction according to an embodiment of the present disclosure.

As shown in FIG. 8, the second sacrificial dielectric layer 22 is patterned along the first direction L1, to form a plurality of first trenches G1 arranged at intervals along the second direction L2 in the second sacrificial dielectric layer 22. A part of the first sacrificial dielectric layer 21 is exposed at the bottoms of the first trenches G1. The second sacrificial dielectric layer 22 may be patterned along the first direction L1 by using an etching process such as a wet etching process or a dry etching process. This is not limited particularly herein. The first trench G1 is configured to be filled, to form a part of the bit line structure 4. Therefore, the critical dimension of the bit line structure 4 can be controlled precisely by controlling the critical dimension of the first trench G1, such that bit line structure 4 with smaller critical dimensions can be obtained. In addition, the bit line structure 4 fills the first trench G1, and does not need to be etched. When the critical dimension of the formed bit line structure 4 is reduced, distortion or collapse will not occur.

It should be noted that the patterning in the embodiments of the present disclosure refers to removing a part of the semiconductor structure according to a specific pattern. For example, an etching process may be used for patterning. In addition, the critical dimension of the bit line structure 4 of the embodiment of the present disclosure refers to the dimension of the bit line structure 4 along the second direction L2, such as, the dimension of the bit line structure from left to right in the cross-sectional view shown in FIG. 22. An angle is formed between the first direction L1 and the second direction L2. In some embodiments, the first direction L1 is perpendicular to the second direction L2. This is not limited particularly herein.

Step S600: Pattern a part of the sacrificial dielectric layer 2 at bottoms of the first trenches G1 and a part of the substrate 1 below the part of the sacrificial dielectric layer 2, and forming a plurality of second trenches G2 arranged at intervals below the first trenches G1, wherein the second trench G2 has a preset depth d1 in the substrate 1.

Figure 9:
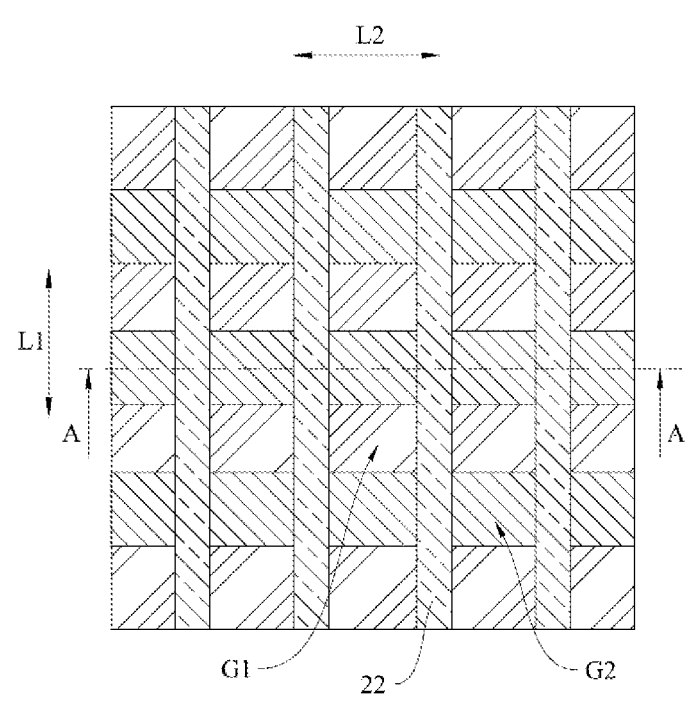
FIG. 9 is a top view of the semiconductor structure with second trenches formed after a first sacrificial dielectric layer is patterned according to an embodiment of the present disclosure.
Figure 10:
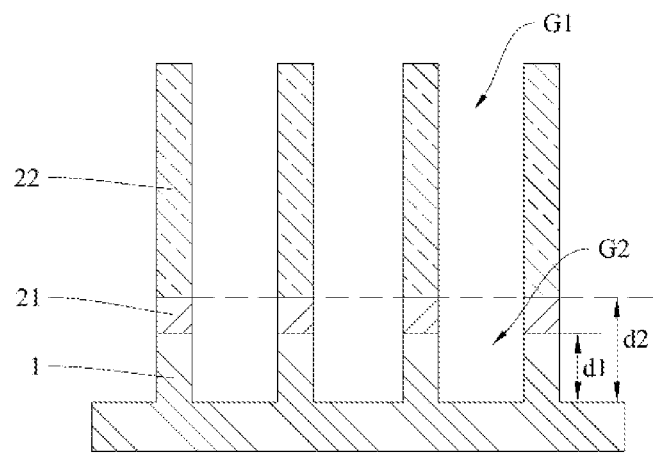
FIG. 10 is a top view (a cross-sectional view of the semiconductor structure in the second direction) in FIG. 9 taken along A-A.

As shown in FIGS. 9 and 10, the part of the first sacrificial dielectric layer 21 exposed by the first trenches G1 and a part of the substrate 1 at a bottom of is the part of the first sacrificial dielectric layer 21 are patterned, to form the second trenches G2 in the first sacrificial dielectric layer 21 and the substrate 1, where in a direction perpendicular to the substrate 1, the second trench G2 has a first depth d2.

In other words, the second trenches G2 arranged at intervals along the first direction L1 are formed at the bottoms of the first trenches G1. In some embodiments, with reference to the top view of FIG. 9, the second trenches G2 are arranged in a matrix. Certainly, in some other embodiments, the second trenches G2 may not be arranged in a matrix. The quantities of the second trenches G2 distributed along the first direction L1 at the bottoms of the first trenches G1 may be equal or unequal, and may be set according to an actual situation. This is not limited herein.

In addition, it should be noted that the second trench G2 extends from the bottom surface of the first sacrificial dielectric layer 21 to the substrate 1 by a preset depth d1. The preset depth d1 is the depth by which the etching is performed downward from the surface of the substrate 1, and may be further understood as the size of the etched substrate 1 in the direction perpendicular to the substrate 1. The first depth d2 is the dimension from the top surface of the first sacrificial dielectric layer 21 to the bottom surface of a part of the substrate 1 with the preset depth d1, that is, the dimension of the entire second trench G2 in the direction perpendicular to the substrate 1. Therefore, the first depth d2 is greater than the preset depth d1. In a top view, the cross section of the second trench G2 may be rectangular, square or circular. This is not limited particularly herein. In other words, the sidewall of the second trench G2 surrounds the periphery of the bottom surface of the second trench G2. Therefore, the shape of the second trench G2 may further be understood as a hole shape.

The second trenches G2 is configured to form the bit line contact layer 42 of the bit line structures 4, and the material of the bit line contact layer 42 may be polysilicon. Therefore, the bit line contact layer 42 of the polysilicon can be is directly deposited in the second trenches G2 through a deposition process, without etching the bit line contact layer 42, thereby avoiding sidewall oxidation, and ensuring the stability of the bit line structure 4.

Step S800: Form a protective layer 3 on sidewalls of the first trenches G1 and sidewalls of the second trenches G2.

Figure 11:
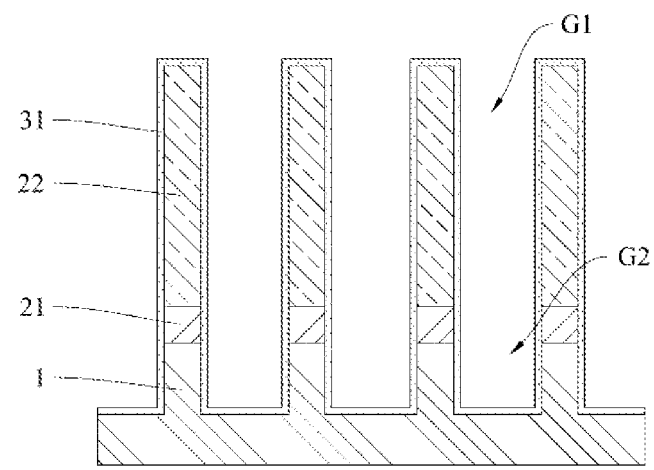
FIGS. 11 to 13 are cross-sectional views of the semiconductor structure with a first protective layer, a second protective layer, and a third protective layer formed respectively along the second direction according to an embodiment of the present disclosure.
Figure 12:
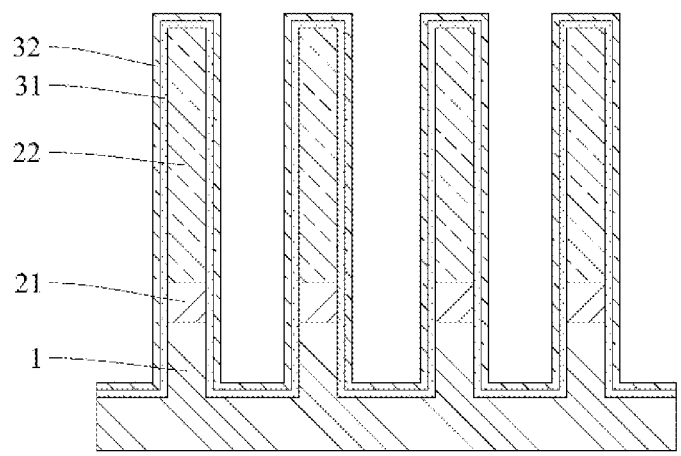
Figure 13:
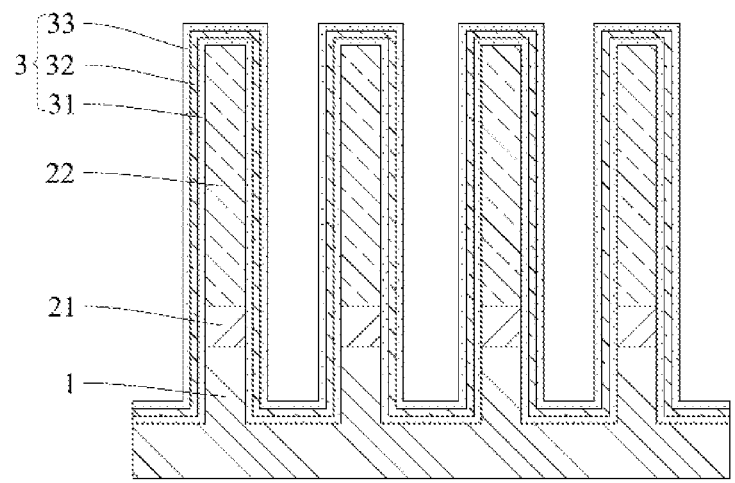

As shown in FIG. 11, a first protective layer 31 covering both the surfaces of the first trenches G1 and the surfaces of the second trenches G2 is formed. As shown in FIG. 12, a second protective layer 32 is formed on the surface of the first protective layer 31. As shown in FIG. 13, the third protective layer 33 is formed on the surface of the second protective layer 32.

Figure 14:
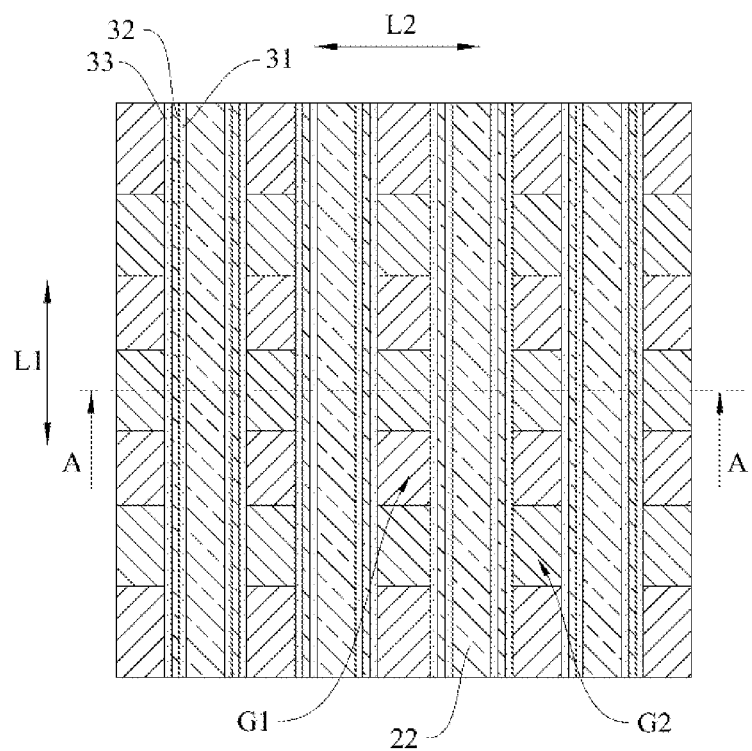
FIG. 14 is a top view of a semiconductor structure with formed second trenches according to an embodiment of the present disclosure.
Figure 15:
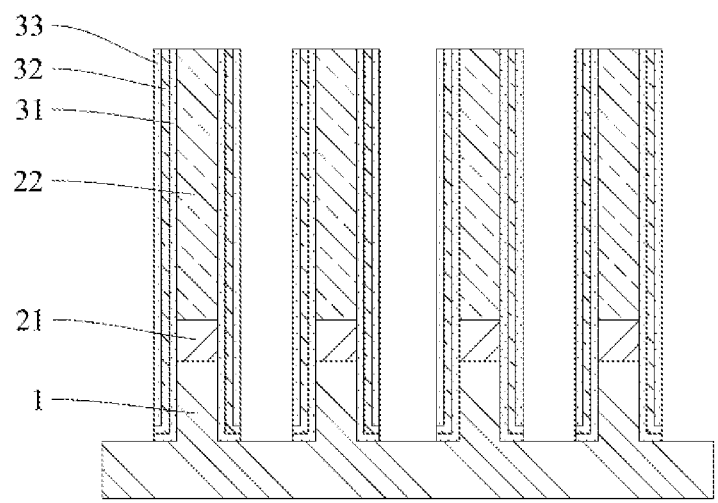
FIG. 15 is a cross-sectional view in FIG. 14 taken along A-A.

As shown in FIGS. 14 and 15, a part of the first protective layer 31, a part of the second protective layer 32, and a part of the third protective layer 33 that are at bottom surfaces of the first trenches G1 and bottom surfaces of the second trenches G2 are removed, to expose a part of the substrate 1 at bottoms of the second trenches G2, and a part of the first protective layer 31, a part of the second protective layer 32, and a part of the third protective layer 33 that are on the sidewalls of the first trenches G1 and the sidewalls of the second trenches G2 are retained, wherein the part of the first protective layer 31, the part of the second protective layer 32, and the part of the third protective layer 33 that are retained form the protective layer 3.

In some embodiments, the first protective layer 31, the second protective layer 32, and the third protective layer 33 may be formed through a deposition process. The materials of the first protective layer 31 and the third protective layer 33 may be silicon nitride (for example, $Si_3N_4$) or SiON, and the material of the second protective layer 32 may be silicon oxide (for example, $SiO_2$).

In some embodiments, the part of the first protective layer 31, the part of the second protective layer 32, and the part of the third protective layer 33 located on the bottom surfaces of the first trenches G1 and the bottom surfaces of the second trenches G2 are removed through the dry etching process. The etching gas used in the dry etching process may be hydrogen fluoride or chlorine gas. The etching degree can be controlled by controlling the amount of etching gas.

Step S1000: Form bit line structures 4 in the first trenches G1 and the second trenches G2.

Figure 16:
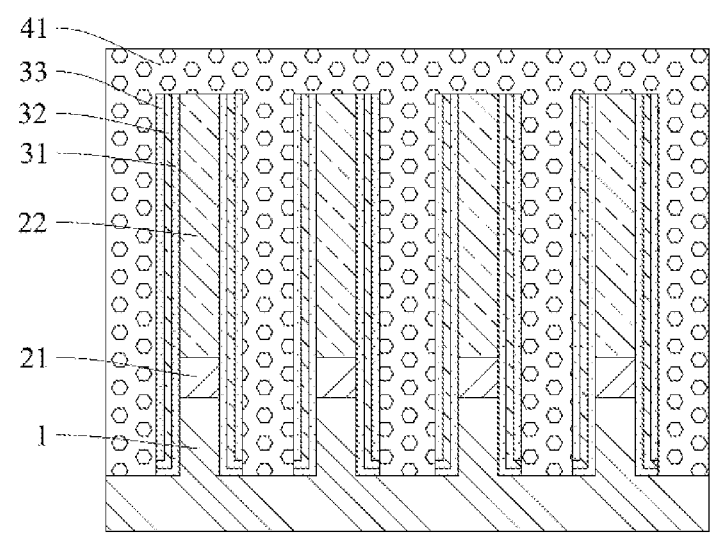
FIGS. 16 and 17 are cross-sectional views of the semiconductor structure with a formed bit line contact layer in the second direction according to an embodiment of the present disclosure.
Figure 17:
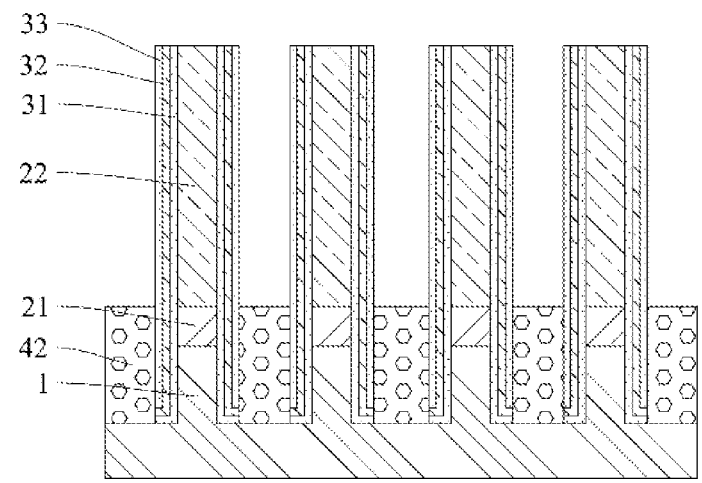

As shown in FIG. 16, the bit line contact material layer 41 may be formed in the second trenches G2 and the first trenches G1 by using a deposition process. The deposition process may be an atomic layer deposition process. The material of the bit line contact material layer 41 may be doped polysilicon. As shown in FIG. 17, the bit line contact material layer 41 is etched back to the second trenches G2, and the bit line contact layer 42 is formed in the second trenches G2. In a direction perpendicular to the substrate 1, a thickness of the bit line contact layer 42 is not smaller than the preset depth d1 of the second trench G2 in the substrate 1 and is not greater than the first depth d2 of the second trench G2. In other words, the top surface of the bit line contact layer 42 is not lower than the top surface of the substrate 1 and is not higher than the top surface of the first sacrificial dielectric layer 21. In this way, the bit line contact layer 42 is completely formed in the second trench G2. The bit line contact material layer 41 may be etched back by using a dry etching process, and the remaining amount of the bit line contact material layer 41 can be controlled by fixing the etching time to serve as the connection lines of the bit line structures 4. The dry etching process is used to etch the bit line contact material layer 41. Compared with the sacrificial dielectric layer 2, the bit line contact material layer 41 made of polysilicon has a higher selectivity ratio, avoiding damage to the sacrificial dielectric layer 2 and the protective layer 3.

Figure 18:
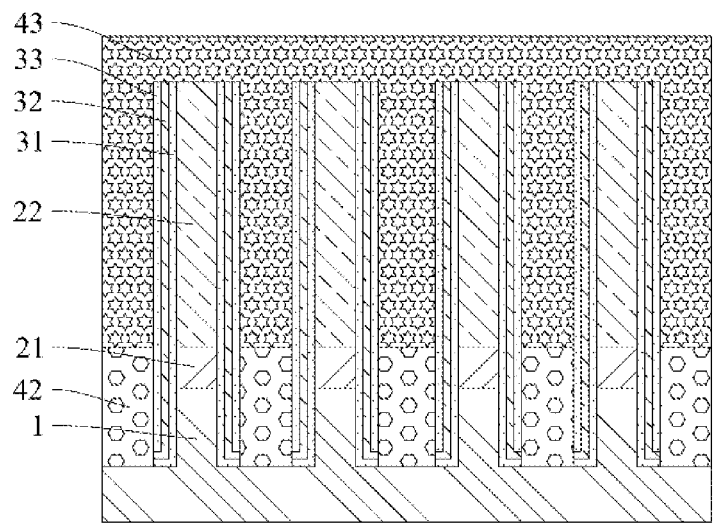
FIGS. 18 and 19 are cross-sectional views of the semiconductor structure with a formed bit line conductive layer in the second direction according to an embodiment of the present disclosure.

As shown in FIG. 18, a conductive material layer 43 is formed on the bit line contact layer 42. Specifically, the conductive material layer may be formed through the chemical vapor deposition process. The material of the conductive material layer 43 may be tungsten, titanium, nickel, aluminum or platinum, and can be selected by those skilled in the art according to the actual situation. This is not limited particularly herein.

Figure 19:
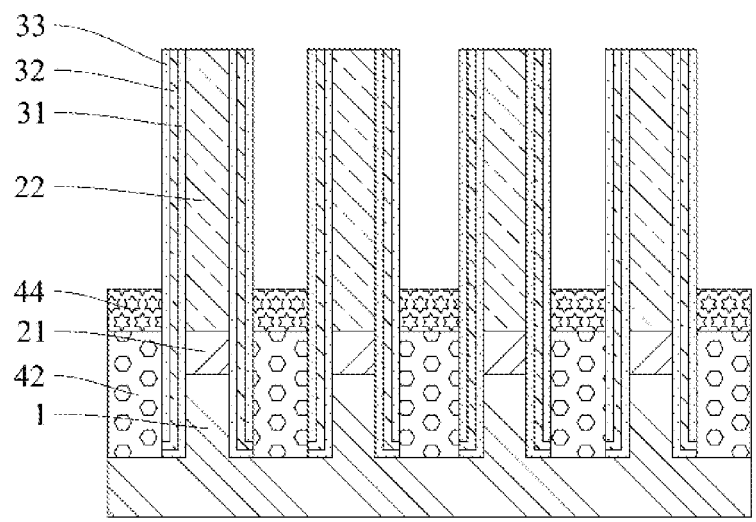

As shown in FIG. 19, the conductive material layer 43 is etched back to form a bit line conductive layer 44 in the first trenches G1, and the bit line conductive layer 44 is connected to the bit line contact layer 42. The top surface of the bit line conductive layer 44 is lower than the top surface of the second sacrificial dielectric layer 22, that is, the bit line conductive layer 44 is located in the first trenches G1. In an embodiment, as shown in FIG. 19, the bit line conductive layer 44 in the direction perpendicular to the substrate 1 is thinner than the bit line contact layer 42. The bit line conductive layer 44 is effective conductive structures in the bit line structures 4.

In some embodiments, the conductive material layer 43 may be etched back through the dry etching process, and the remaining amount of the conductive material layer 43 can be controlled by adjusting the etching time. The used dry etching process is not only simple to operate, but also has a higher etching selectivity ratio for the metal conductive material layer 43 compared with the second sacrificial dielectric layer 22 and the protective layer 3, avoiding damage to the second sacrificial dielectric layer 22 and the protective layer 3.

Figure 20:
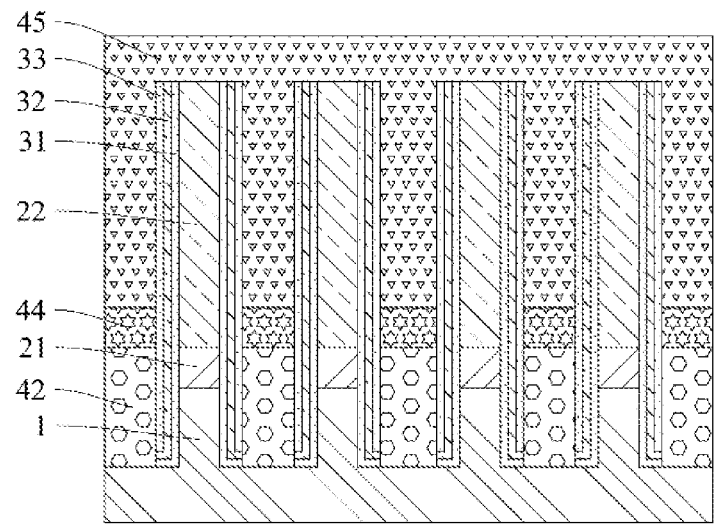
FIGS. 20 and 21 are cross-sectional views of the semiconductor structure with a formed bit line insulating layer in the second direction according to an embodiment of the present disclosure.

As shown in FIG. 20, an insulating material layer 45 is formed on the bit line conductive layer 44. In some embodiments, the insulating material layer 45 may be formed through furnace tube deposition. The material of the insulating material layer 45 may be $Si_3N_4$. In some embodiments, the insulating material layer 45 and the first sacrificial dielectric layer 21 may be made of a same material such as silicon nitride.

Figure 21:
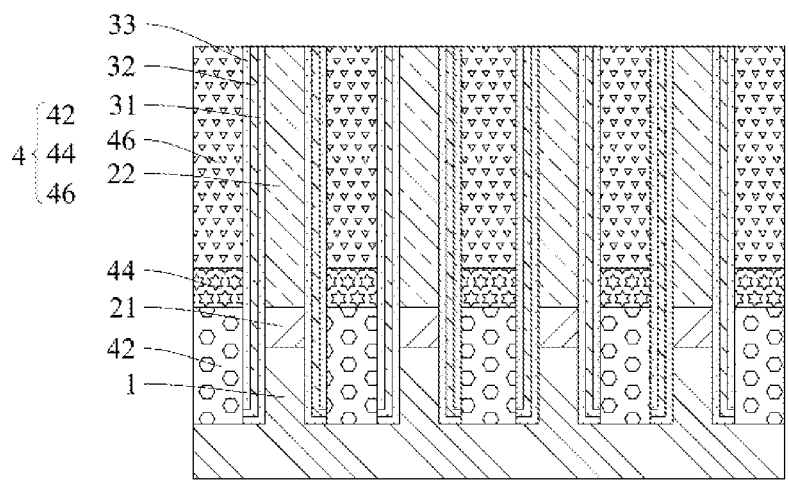
Figure 22:
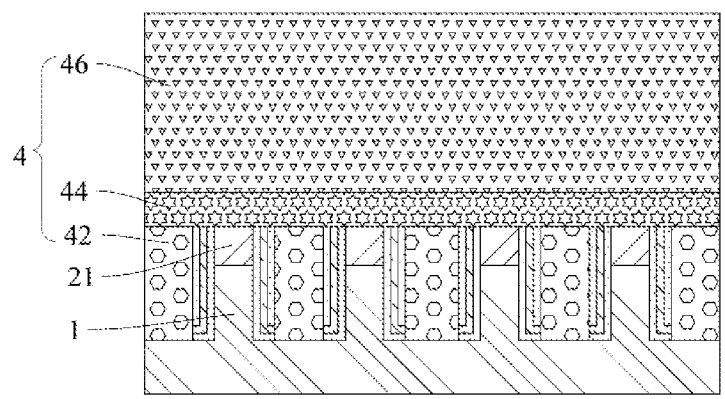
FIG. 22 is a cross-sectional view of the semiconductor structure with formed bit line structures in the first direction according to an embodiment of the present disclosure.

As shown in FIG. 21, the insulating material layer 45 may be etched through the dry etching process. The second sacrificial dielectric layer 22 is used as an etching stop layer to completely expose the second sacrificial dielectric layer 22. A bit line insulating layer 46 is formed in the first trenches G1 and on the bit line conductive layer 44. The top surface of the bit line insulating layer 46 is not higher than the top surface of the second sacrificial dielectric layer 22. In an embodiment, the top surface of the bit line insulating layer 46 is flush with the top surface of the exposed second sacrificial dielectric layer 22. The bit line contact layer 42, the bit line conductive layer 44 and the bit line insulating layer 46 in the above embodiments form the bit line structures 4. To show the bit line structure 4 more clearly, refer to FIG. 22, which is a cross-sectional view of the semiconductor structure in the first direction L1.

It can be seen from the above that the bit line structures 4 in the embodiment of the present disclosure are formed by filling the second trenches G2 and the first trenches G1 with the protective layer 3 formed on their sidewalls. Because the dimensions of the first trench G1 and the second trench G2 can be controlled more precisely, the bit line structure 4 in the embodiment of the present disclosure can have a smaller critical dimension, and is less prone to deformation, thereby improving stability.

After the bit line structure 4 is formed, the capacitive contact structures 6 may also be formed. In some embodiments, the manufacturing method further includes steps S1200 to S1800.

Step S1200: Form a mask layer 5 on a top surface of the second sacrificial dielectric layer 22, a top surface of the bit line insulating layer 46, a top surface of the protective layer 3.

Figure 23:
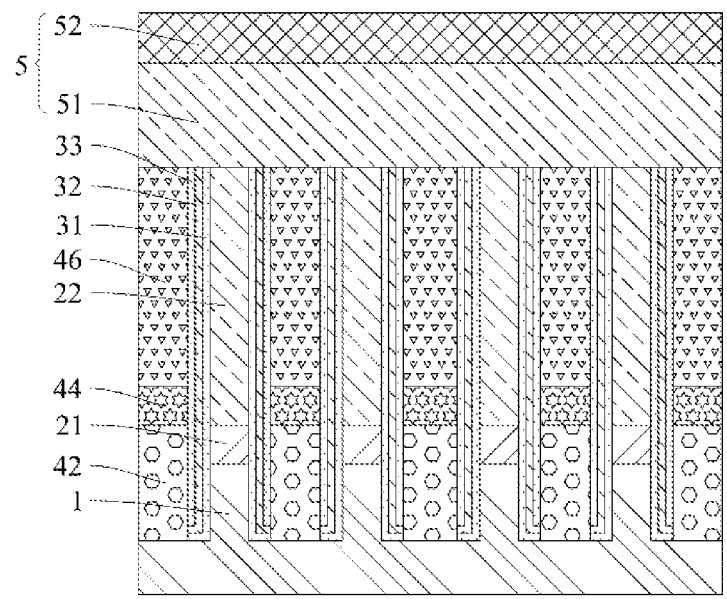
FIG. 23 is a cross-sectional view of the semiconductor structure with a formed mask layer in the second direction according to an embodiment of the present disclosure.

As shown in FIG. 23, a mask layer 5 may be formed on the top surface of the second sacrificial dielectric layer 22, the top surface of the bit line insulating layer 46, and the top surface of the protective layer 3. The mask layer 5 may be formed through the chemical vapor deposition process. In some embodiments, with reference to FIG. 23, the mask layer 5 may include: a first mask layer 51 and a second mask layer 52 that are stacked sequentially. In some other embodiments, the mask layer 5 may further only include the first mask layer 51. The material of the first mask layer 51 may be only silicon oxide (for example, $SiO_2$), and the material of the second mask layer 52 may be $Si_3N_4$ or SiON.

Figure 24:
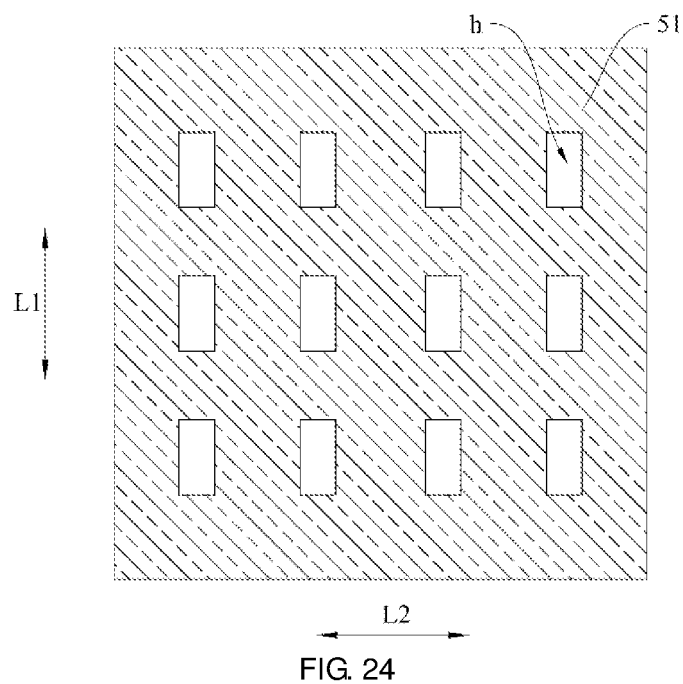
FIG. 24 is a top view of forming pattern holes in the mask layer according to an embodiment of the present disclosure.

Step S1400: As shown in FIG. 24, pattern the mask layer 5, and form a plurality of pattern holes h arranged at intervals in the mask layer 5, wherein the pattern hole h exposes a part of a top surface of a part of the second sacrificial dielectric layer 22 between adjacent two of the bit line structures 4 in the second direction L2, and a top surface of a part of the second sacrificial dielectric layer 22 between adjacent two of the pattern holes h in the first direction L1 is covered by the mask layer 5. In some embodiments, step S1400 may specifically include steps S1401 to S1403.

Step S1401: Form a first mask layer 51, wherein the first mask layer 51 is provided with a plurality of first patterns extending along the first direction L1 and arranged at intervals along the second direction L2, and the first pattern covers the bit line structure 4.

The first mask layer 51 is patterned. Specifically, a part of the first mask layer 51 that does not cover the bit line structures 4 is etched along the first direction L1. The remaining part of the first mask layer 51 forms the first patterns extending along the first direction L1 and arranged at intervals along the second direction L2, such that the first patterns can completely cover the bit line structures 4 located thereunder. A temporary material (not shown in the figure) fills a space between the first patterns arranged at intervals. In some embodiments, the temporary material is different from the material of the first mask layer 51.

Step S1402: Form a second mask layer 52 on the first mask layer 51, wherein the second mask layer 52 is provided with a plurality of second patterns extending along the second direction L2 and arranged at intervals along the first direction L1.

The second mask layer 52 is formed on the first mask layer 51, and the second mask layer 52 is patterned. Specifically, a part of the second mask layer 52 is etched along the second direction L2, and the second patterns extending along the second direction L2 and arranged at intervals along the first direction L1 are retained.

Step S1403: As shown in FIG. 24, transfer the second patterns into the first mask layer 51, remove a part of the first mask layer 51 that is not covered by is the first patterns and the second patterns, and form the pattern holes h. In this way, a part of the temporary material corresponding to the pattern holes in the first mask layer 51 is removed. Because the temporary material is different from the material of the first mask layer 51 and has different etching selectivity ratios, the part of the temporary material corresponding to the pattern holes can be removed though the etching process without damaging the remaining part of the first mask layer 51. As shown in FIG. 24, the pattern holes h may be arranged in a matrix and located between adjacent bit line structures 4.

In some other embodiments, the mask layer 5 includes only one first mask layer 51. The pattern holes h may be formed directly on the first mask layer 51. That is, the pattern with the pattern holes h can be directly transferred onto the first mask layer 51. Those skilled in the art can obtain the transferring of the pattern according to the related art. Details are not repeated herein.

Figure 25:
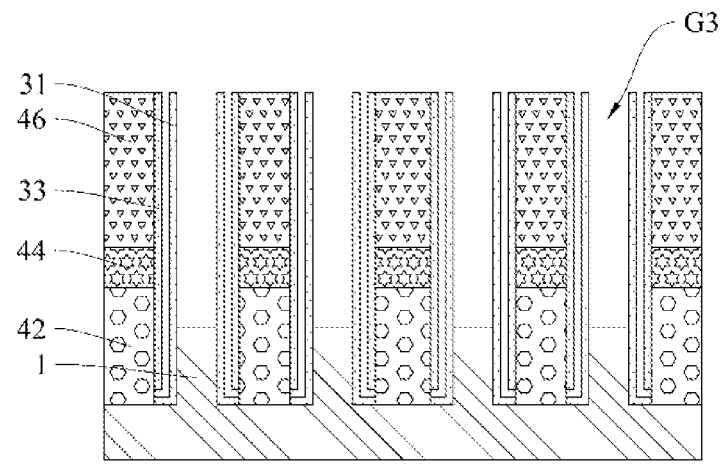
FIG. 25 is a cross-sectional view of the semiconductor structure with formed third trenches in the second direction according to an embodiment of the present disclosure.

Step S1600: As shown in FIG. 25, pattern the second sacrificial dielectric layer 22 and the first sacrificial dielectric layer 21 below the second sacrificial dielectric layer 22 along the pattern holes h, and form third trenches G3 in the first sacrificial dielectric layer 21 and the second sacrificial dielectric layer 22, wherein a bottom surface of the third trench G3 exposes a part of a surface of a part of the substrate 1 between adjacent two of the bit line structures 4 in the second direction L2.

By using an etching process, a part of the second sacrificial dielectric layer 22 and a part of the first sacrificial dielectric layer 21 located below the second sacrificial dielectric layer 22 are removed through etching along the pattern holes h, that is, the third trenches G3 are formed in the first sacrificial dielectric layer 21 and the second sacrificial dielectric layer 22. In some embodiments, the pattern holes h are arranged in a matrix, and therefore the third trenches G3 are also arranged in a matrix.

In some embodiments, the first mask layer 51 and the second sacrificial dielectric layer 22 have a same material such as $SiO_2$. The first mask layer 51 is removed when the second sacrificial dielectric layer 22 and the first sacrificial is dielectric layer 21 below the second sacrificial dielectric layer 22 are patterned along the pattern holes h, to form the third trenches G3 in the first sacrificial dielectric layer 21 and the second sacrificial dielectric layer 22. This can save the process and improve efficiency.

In some embodiments, the part of the second protective layer 32 that is retained can be removed through a drying etching process after the second sacrificial dielectric layer 22 is patterned along the pattern holes h, and then the first sacrificial dielectric layer 21 is patterned. After the part of the second protective layer 32 that is retained is removed, an air gap can be formed between the part of the first protective layer 31 and the part of the third protective layer 33 that are retained, that is, the protective layer 3 of the bit line structures 4 has an air gap, which can reduce the parasitic capacitance between the bit line structures 4, to obtain good electrical properties.

Step S1800: Form capacitive contact structures 6 in the third trenches G3.

In some other embodiments, the manufacturing method further includes steps S1200' to S1800'.

Step S1200': Form a mask layer 5 on a top surface of the second sacrificial dielectric layer 22, a top surface of the bit line insulating layer 46, a top surface of the protective layer 3.

Step S1400': Pattern the mask layer 5, and form a plurality of pattern holes h arranged at intervals in the mask layer 5, wherein the pattern hole h exposes a part of the top surface of a part of the second sacrificial dielectric layer 22 between adjacent two of the bit line structures 4 in the second direction L2 and a part of a top surface of a part of the protective layer 3 between adjacent two of the bit line structures 4 in the second direction L2, and the top surface of a part of the second sacrificial dielectric layer 22 between adjacent two of the pattern holes h in the first direction L1 is covered by the mask layer 5.

Step S1400' is different from step S1400. In step S1400, the pattern hole h of the mask layer 5 only exposes the part of the top surface of the part of the second sacrificial dielectric layer 22, but in step S1400', the pattern hole h of the mask layer 5 not only exposes the part of the top surface of the part of the second sacrificial dielectric layer 22, but also exposes the part of the top surface of the part of the protective layer 3. In a subsequent step, the part of the second protective layer 32 that is retained in the protective layer 3 can be removed, while the parts of the second sacrificial dielectric layer 22 are removed.

The formation process of the pattern holes h in step S1400' is the same as that in steps S1401 to S1403 in step S1400. This is not repeated herein.

Step S1600': Pattern the second sacrificial dielectric layer 22 and the first sacrificial dielectric layer 21 below the second sacrificial dielectric layer 22 along the pattern holes h, and form third trenches G3 in the first sacrificial dielectric layer 21 and the second sacrificial dielectric layer 22, and remove the part of the second protective layer 32 that is retained in the protective layer 3, wherein a bottom surface of the third trench G3 exposes a part of a surface of a part of the substrate 1 between adjacent two of the bit line structures 4 in the second direction L2.

Step S1600' is different from step S1600. In step S1600, because the part of the protective layer 3 is not exposed by the pattern hole h, in the patterning process, only the parts of the first sacrificial dielectric layer 21 and the parts of the second sacrificial dielectric layer 22 are removed to form the third trenches G3, and the part of the second protective layer 32 that is retained is not removed. In step S1600', the part of the top surface of the part of the protective layer 3 is exposed by the pattern hole h. Therefore, the part of the second protective layer 32 that is retained is also removed when the parts of the second sacrificial dielectric layer 22 are removed. That is, in step S1600', the parts of the second sacrificial dielectric layer 22 and the part of the second protective layer 32 that is retained can be removed at the same time. Compared with the foregoing embodiment in which the parts of the second sacrificial dielectric layer 22 are removed first and then the part of the second protective layer 32 that is retained is removed, this step is simpler and saves time.

In this embodiment, the second protective layer 32 and the second sacrificial dielectric layer 22 have a same material such as silicon oxide. The first protective layer 31 and the third protective layer 33 have a same material such as $Si_3N_4$. The part of the second protective layer 32 that is retained and the parts of the second sacrificial dielectric layer 22 may be removed by using an etching process. Because a material of the second protective layer 32 is different from a material of the first protective layer 31 and a material the third protective layer 33, and the etchant or etching gas in the etching process has different etching selectivity ratios for different materials, the part of the second protective layer 32 that is retained can be removed through etching without damaging the part of the first protective layer 31 and the part of the third protective layer 33 that are retained.

After the part of the second protective layer 32 that is retained and the parts of the second sacrificial dielectric layer 22 are removed, the etching can be continued to remove the parts of the first sacrificial dielectric layer 21. It should be noted that because the material of the first sacrificial dielectric layer 21 may be silicon nitride, the etchant or etching gas needs to be replaced. In addition, when the first protective layer 31, the third protective layer 33 and the first sacrificial dielectric layer 21 are all made of silicon nitride, anisotropic etching can be performed. In other words, by controlling the etching direction, only the parts of the first sacrificial dielectric layer 21 is etched out, and the part of the first protective layer 31 and the part of the third protective layer 33 that are retained are not etched and retained completely, such that an air gap is formed in the part of the first protective layer 31 and the part of the third protective layer 33 that are retained. The protective layer 3 of the finally formed bit line structures 4 has an air gap, which can reduce the parasitic capacitance between the bit line structures 4 and obtain good electrical performance.

Step S1800': Form capacitive contact structures 6 in the third trenches G3.

Step S1200' is the same as step S1200, and step S1800' is the same as step S1800.

Figure 26:
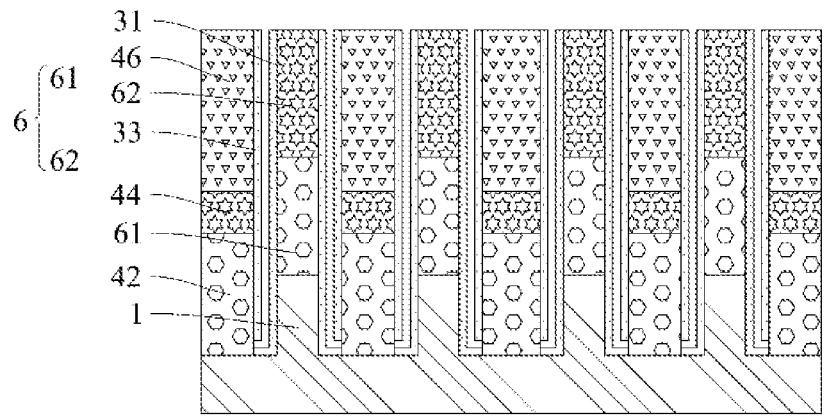
FIG. 26 is a cross-sectional view of the semiconductor structure with formed capacitive contact structures in the second direction according to an embodiment of the present disclosure.

As shown in FIG. 26, in step S1800 and step S1800', the forming capacitive contact structures 6 in the third trenches G3 includes: forming a capacitive contact layer 61 on a surface of a part of the substrate 1 at bottoms of the third trenches G3; and forming a metal connection layer 62 on the capacitive contact layer 61.

Specifically, a capacitor contact material layer may be deposited in the third trenches G3 first, and then the capacitor contact material layer may be etched back to form the capacitive contact layer 61. The material of the capacitive contact layer 61 may be polysilicon. A metal connection layer 62 is deposited on the capacitive contact layer 61 of the third trenches G3, and the metal connection layer 62 fills up the third trenches G3. A chemical mechanical polishing (CMP) process is used to make the top surface of the metal connection layer 62, the top surface of the protective layer 3, and the top surface of the bit line insulating layer 46 flush with each other, so as to facilitate the implementation of subsequent processes.

It can be seen from the above description that after the formation of the bit line structures 4, the remaining part of the sacrificial dielectric layer 2 between the bit line structures 4 does not need to be removed, but can be used continuously to form the remaining part of the sacrificial dielectric layer 2 of the third trenches G3 in the subsequent process of the capacitive contact structures 6. Therefore, there is no need to use the spin coating process and the CMP process to prepare the remaining part of the sacrificial dielectric layer 2. This saves costs.

In summary, in the embodiments of the present disclosure, the first trenches G1 and the second trenches G2 are first formed in the sacrificial dielectric layer 2 and the semiconductor substrate 1, and then the first trenches G1 and the second trenches G2 are filled to form the bit line structures 4. Therefore, the bit line structure 4 of the embodiments of the present disclosure is not formed directly through etching, but is formed by filling the trenches, such that the bit line structure can have a smaller critical dimension, and the sidewall oxidation of the bit line structure 4 can be avoided, thereby avoiding distortion and collapse of the bit line structure 4. In addition, after the bit line structures 4 are formed, the remaining part of the sacrificial dielectric layer 2 does not need to be removed, and can be used in the subsequent process of forming the capacitive contact structures 6, thereby saving costs.

According to another aspect of the present disclosure, a semiconductor structure is provided and includes substrate 1, word line structures, bit line structures 4, and transistors. The transistors are disposed in the substrate 1, and are each provided with a gate, a drain, and a source. The semiconductor structure is prepared by the manufacturing method in any one of the foregoing embodiments. This is not repeated herein.

The bit line structure 4 of the semiconductor structure of the embodiment of the present disclosure can have a smaller critical dimension, is less likely to be distorted or collapse, and has more stable electrical performance and lower costs.

It should be understood that the present disclosure does not limit its application to the detailed structure and arrangement of components set forth in this specification. The present disclosure can have other embodiments and can be implemented and executed in various ways. The above variations and modifications fall within the scope of the present disclosure. It should be understood that the present disclosure disclosed and defined in this specification can extend to all alternative combinations of two or more individual features mentioned or apparent in the text and/or accompanying drawings. All of these different combinations constitute various alternative aspects of the present disclosure. The embodiments described in this specification illustrate the known optimal manner for implementing the present disclosure, and enables those skilled in the art to use the present disclosure.

The invention claimed is:

1. A method of manufacturing a semiconductor structure, comprising:
    providing a substrate, and forming a sacrificial dielectric layer on the substrate;
    patterning a part of the sacrificial dielectric layer along a first direction, and forming a plurality of first trenches arranged at intervals along a second direction in the sacrificial dielectric layer;
    patterning a part of the sacrificial dielectric layer at bottoms of the first trenches and a part of the substrate below the part of the sacrificial dielectric layer, and forming a plurality of second trenches arranged at intervals below the first trenches, wherein the second trench has a preset depth in the substrate;
    forming a protective layer on sidewalls of the first trenches and sidewalls of the second trenches; and
    forming bit line structures in the first trenches and the second trenches.

2. The method according to claim 1, wherein the forming a sacrificial dielectric layer on the substrate comprises:
    forming a first sacrificial dielectric layer on the substrate; and
    forming a second sacrificial dielectric layer on the first sacrificial dielectric layer.

3. The method according to claim 2, wherein the patterning a part of the sacrificial dielectric layer along a first direction, and forming a plurality of first trenches arranged at intervals along a second direction in the sacrificial dielectric layer comprises: patterning the second sacrificial dielectric layer along the first direction, and forming the first trenches arranged at intervals along the second direction in the second sacrificial dielectric layer, wherein the bottoms of the first trenches expose a part of the first sacrificial dielectric layer.

4. The method according to claim 3, wherein the patterning a part of the sacrificial dielectric layer at bottoms of the first trenches and a part of the substrate below the part of the sacrificial dielectric layer, and forming a plurality of second trenches arranged at intervals below the first trenches comprises: patterning the part of the first sacrificial dielectric layer exposed by the first trenches and a part of the substrate at a bottom of the part of the first sacrificial dielectric layer, and forming the second trenches in the first sacrificial dielectric layer and the substrate, wherein in a direction perpendicular to the substrate, the second trench has a first depth.

5. The method according to claim 2, wherein the forming a protective layer on sidewalls of the first trenches and sidewalls of the second trenches comprises:
    forming a first protective layer covering both surfaces of the first trenches and surfaces of the second trenches;
    forming a second protective layer on a surface of the first protective layer;
    forming a third protective layer on a surface of the second protective layer; and
    removing a part of the first protective layer, a part of the second protective layer, and a part of the third protective layer that are at bottom surfaces of the first trenches and bottom surfaces of the second trenches, to expose a part of the substrate at bottoms of the second trenches, and retaining a part of the first protective layer, a part of the second protective layer, and a part of the third protective layer that are on the sidewalls of the first trenches and the sidewalls of the second trenches, wherein the part of the first protective layer, the part of the second protective layer, and the part of the third protective layer that are retained form the protective layer.

6. The method according to claim 5, wherein the forming bit line structures in the first trenches and the second trenches comprises:
    forming a bit line contact layer in the second trenches;
    forming a bit line conductive layer in the first trenches, wherein the bit line conductive layer is connected to the bit line contact layer; and
    forming a bit line insulating layer in the first trenches and on the bit line conductive layer; wherein
    the bit line contact layer, the bit line conductive layer, and the bit line insulating layer form the bit line structures.

7. The method according to claim 6, wherein in a direction perpendicular to the substrate, the second trench has a first depth, a thickness of the bit line contact layer is not smaller than the preset depth of the second trench in the substrate and is not greater than the first depth, and a top surface of the bit line insulating layer is not higher than a top surface of the second sacrificial dielectric layer.

8. The method according to claim 7, after the forming bit line structures, the method further comprises:
    forming a mask layer on the top surface of the second sacrificial dielectric layer, the top surface of the bit line insulating layer, and a top surface of the protective layer;
    patterning the mask layer, and forming a plurality of pattern holes arranged at intervals in the mask layer, wherein the pattern hole exposes a part of a top surface of a part of the second sacrificial dielectric layer between adjacent two of the bit line structures in the second direction, and a top surface of a part of the second sacrificial dielectric layer between adjacent two of the pattern holes in the first direction is covered by the mask layer;
    patterning the second sacrificial dielectric layer and the first sacrificial dielectric layer below the second sacrificial dielectric layer along the pattern holes, and forming third trenches in the first sacrificial dielectric layer and the second sacrificial dielectric layer, wherein a bottom surface of the third trench exposes a part of a surface of a part of the substrate between adjacent two of the bit line structures in the second direction; and
    forming capacitive contact structures in the third trenches.

9. The method according to claim 7, after the forming bit line structures, the method further comprises:
- forming a mask layer on the top surface of the second sacrificial dielectric layer, the top surface of the bit line insulating layer, and a top surface of the protective layer;
- patterning the mask layer, and forming a plurality of pattern holes arranged at intervals in the mask layer, wherein the pattern hole exposes a part of a top surface of a part of the second sacrificial dielectric layer between adjacent two of the bit line structures in the second direction and a part of a top surface of a part of the protective layer between the adjacent two of the bit line structures in the second direction, and a top surface of a part of the second sacrificial dielectric layer between adjacent two of the pattern holes in the first direction is covered by the mask layer;
- patterning the second sacrificial dielectric layer and the first sacrificial dielectric layer below the second sacrificial dielectric layer along the pattern holes, and forming third trenches in the first sacrificial dielectric layer and the second sacrificial dielectric layer, and removing the part of the second protective layer that is retained in the protective layer, wherein a bottom surface of the third trench exposes a part of a surface of a part of the substrate between adjacent two of the bit line structures in the second direction; and
- forming capacitive contact structures in the third trenches.

10. The method according to claim 8, wherein the patterning the mask layer, and forming a plurality of pattern holes arranged at intervals in the mask layer comprises:
- forming a first mask layer, wherein the first mask layer is provided with a plurality of first patterns extending along the first direction and arranged at intervals along the second direction, and the first pattern covers the bit line structure;
- forming a second mask layer on the first mask layer, wherein the second mask layer is provided with a plurality of second patterns extending along the second direction and arranged at intervals along the first direction; and
- transferring the second patterns into the first mask layer, removing a part of the first mask layer that is not covered by the first patterns and the second patterns, and forming the pattern holes.

11. The method according to claim 10, wherein the first mask layer and the second sacrificial dielectric layer have a same material, and a remaining part of the first mask layer is removed while the patterning the second sacrificial dielectric layer and the first sacrificial dielectric layer below the second sacrificial dielectric layer along the pattern holes, and forming the third trenches in the first sacrificial dielectric layer and the second sacrificial dielectric layer.

12. The method according to claim 8, further comprising: removing the part of the second protective layer that is retained through a drying etching process after the patterning the second sacrificial dielectric layer along the pattern holes, and patterning the first sacrificial dielectric layer.

13. The method according to claim 8, wherein the forming capacitive contact structures in the third trenches comprises:
- forming a capacitive contact layer on a surface of a part of the substrate at bottoms of the third trenches; and
- forming a metal connection layer on the capacitive contact layer.

14. The method according to claim 9, wherein the second protective layer and the second sacrificial dielectric layer have a same material, and the first protective layer and the third protective layer have a same material.

15. The method according to claim 9, wherein the patterning the mask layer, and forming a plurality of pattern holes arranged at intervals in the mask layer comprises:
- forming a first mask layer, wherein the first mask layer is provided with a plurality of first patterns extending along the first direction and arranged at intervals along the second direction, and the first pattern covers the bit line structure;
- forming a second mask layer on the first mask layer, wherein the second mask layer is provided with a plurality of second patterns extending along the second direction and arranged at intervals along the first direction; and
- transferring the second patterns into the first mask layer, removing a part of the first mask layer that is not covered by the first patterns and the second patterns, and forming the pattern holes.

16. The method according to claim 9, wherein the forming capacitive contact structures in the third trenches comprises:
- forming a capacitive contact layer on a surface of a part of the substrate at bottoms of the third trenches; and
- forming a metal connection layer on the capacitive contact layer.

17. A semiconductor structure, manufactured by using the method according to claim 1.

* * * * *